United States Patent
Wentzloff et al.

(10) Patent No.: US 10,992,503 B1
(45) Date of Patent: Apr. 27, 2021

(54) SYSTEMS AND METHODS FOR A CRYSTAL-LESS BLUETOOTH LOW ENERGY TRANSCEIVER

(71) Applicant: THE REGENTS OF THE UNIVERSITY OF MICHIGAN, Ann Arbor, MI (US)

(72) Inventors: David D. Wentzloff, Ann Arbor, MI (US); Abdullah Mohammed G Alghaihab, Ann Arbor, MI (US); Xing Chen, Ann Arbor, MI (US); Yao Shi, Sunnyvale, CA (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 16/791,515

(22) Filed: Feb. 14, 2020

(51) Int. Cl.
*H04L 27/12* (2006.01)
*H04B 1/7156* (2011.01)
*H04B 1/40* (2015.01)
*H04L 7/033* (2006.01)

(52) U.S. Cl.
CPC ............ *H04L 27/125* (2013.01); *H04B 1/40* (2013.01); *H04B 1/7156* (2013.01); *H04L 7/0331* (2013.01); *H04B 2001/71563* (2013.01)

(58) Field of Classification Search
CPC ... H04B 1/40; H04B 1/38; H04B 1/50; H04B 1/713; H04B 1/7156; H04L 27/10; H04L 27/16; H04L 27/125; H04L 27/127; H04L 7/0331; H04W 4/80; H04W 52/0229
See application file for complete search history.

(56) References Cited

U.S. PATENT DOCUMENTS

| | | | |
|---|---|---|---|
| 6,308,048 B1 * | 10/2001 | Gore ...................... | H03D 7/163 455/76 |
| 6,480,553 B1 * | 11/2002 | Ho ...................... | H04L 27/2028 329/300 |
| 7,398,074 B2 * | 7/2008 | Pfann ...................... | H04B 1/30 455/118 |
| 8,155,055 B2 | 4/2012 | Haartsen et al. | |
| 10,212,657 B2 | 2/2019 | Wiser | |
| 2013/0165044 A1 | 6/2013 | Xie et al. | |
| 2019/0372577 A1 | 12/2019 | Yehezkely | |

* cited by examiner

*Primary Examiner* — Betsy Deppe
(74) *Attorney, Agent, or Firm* — Harness, Dickey & Pierce, P.L.C.

(57) ABSTRACT

A transceiver includes a receive circuit configured to receive an incoming signal and recover a reference signal at a reference frequency from the incoming signal. The incoming signal is a wireless packet. A first oscillator generates a signal at a set of predetermined frequencies. A first phase lock loop (PLL) interfaced with the first oscillator. The first PLL is configured to adjust a first oscillator frequency of the first oscillator based on an incoming frequency of the incoming signal using the reference frequency. A transmit circuit includes a second oscillator configured to generate a carrier signal at a predetermined frequency and a modulator configured to modulate data over the carrier signal at the predetermined frequency. The transmit circuit includes a second PLL interfaced with the second oscillator that sets the second oscillator to generate the carrier signal at the predetermined frequency using the reference signal. The transmit circuit transmits the modulated carrier signal.

20 Claims, 10 Drawing Sheets

SYSTEMS AND METHODS FOR A CRYSTAL-LESS BLUETOOTH LOW ENERGY TRANSCEIVER

GOVERNMENT SUPPORT CLAUSE

This invention was made with government support under ECCS1507192 awarded by the National Science Foundation. The government has certain rights in the invention.

FIELD

The present disclosure relates to low energy wireless transceivers excluding crystal oscillators.

BACKGROUND

Wireless transceivers traditionally perform local oscillator calibration using an external crystal oscillator that adds significant size and cost to a system. Most wireless transceivers or radios need a crystal oscillator to operate in order to keep track of the timing so that the radio can communicate at the exact frequency necessary. However, crystal oscillators are bulky, heavy, and expensive. Removing the crystal oscillator enables a true single-chip radio, but an alternate means for calibrating the local oscillator is required. Integrated references like on-chip LC or relaxation oscillators are either high power or have PVT sensitivity too high for wireless standards.

Multiple crystal-less radios attempt to address this challenge. In one example, the crystal oscillator is replaced with an FBAR resonator, which is still not fully-integrated. In another example, a reference clock is recovered from a received signal but takes too long to lock and are thus highly susceptible to interference. In a further example, an open-loop LC oscillator is used to reduce power but has insufficient frequency accuracy for wireless standards.

This section provides background information related to the present disclosure which is not necessarily prior art.

SUMMARY

This section provides a general summary of the disclosure, and is not a comprehensive disclosure of its full scope or all of its features.

A transceiver includes a receive circuit configured to receive an incoming signal and, in response to detecting the wireless packet, recover a reference signal at a reference frequency from the incoming signal. The incoming signal is a wireless packet. A first oscillator generates a signal at a set of predetermined frequencies and a first phase lock loop (PLL) is interfaced with the first oscillator. The first PLL is configured to, in response to detecting the wireless packet, adjust a first oscillator frequency of the first oscillator based on an incoming frequency of the incoming signal using the reference frequency.

A transmit circuit includes a second oscillator configured to generate a carrier signal at a predetermined frequency and a modulator configured to modulate data over the carrier signal at the predetermined frequency. The transmit circuit includes a second PLL interfaced with the second oscillator. The second PLL is configured to, in response to the first PLL setting the first oscillator, set the second oscillator to generate the carrier signal at the predetermined frequency using the reference signal. The predetermined frequency is a ratio of the reference frequency of the reference signal. The transmit circuit is configured to transmit the modulated carrier signal in response to the transmit circuit being set to a transmit mode.

In other features, the first PLL is configured to adjust the first oscillator frequency by averaging the incoming frequency of the incoming signal over a predetermined period, where frequency modulation of the reference frequency is removed. In other features, the second PLL is configured to set the second oscillator to generate the carrier signal at the predetermined frequency using the reference frequency by averaging the predetermined frequency of the carrier signal over a predetermined period, where frequency modulation of the reference frequency is removed.

In other features, the transceiver includes a second receiver configured to identify the wireless packet in response to receiving an expected signal at an expected frequency, where the expected frequency is included in the set of predetermined frequencies. The second receiver transmits a first enable instruction to the first PLL indicating the wireless packet is detected and transmits a second enable instruction to the second PLL indicating the first PLL set the first oscillator.

In other features, the wireless packet is a sequence of packets and the transmit circuit is set to the transmit mode in response to a final packet of the sequence of packets elapsing when the first oscillator and the second oscillator are locked to the incoming signal using the reference frequency.

In other features, the transceiver includes a mixer interfaced with the receiver circuit and the first oscillator. The first PLL is configured to average the incoming frequency of the incoming signal over a predetermined period and forward the averaged incoming frequency to the first oscillator for forwarding to the mixer. In other features, the first oscillator operates as an open loop oscillator when detecting the wireless packet. In other features, the transceiver excludes a crystal oscillator, and wherein the crystal oscillator does not provide the reference frequency. In other features, the set of predetermined frequencies includes a first frequency, a second frequency, and a third frequency.

In other features, the first oscillator identifies the wireless packet in response to receiving, within a predetermined advertising period, a first signal at a first frequency when the first oscillator is generating the first frequency, a second signal at a second frequency when the first oscillator is generating the second frequency, and a third signal at a third frequency when the first oscillator is generating the third frequency.

In other features, the wireless packet includes a sequence of packets. In other features, the transceiver includes a second receiver to identify the sequence of packets in response to receiving, within the predetermined advertising period, the first signal at the first frequency and an absence of signal at the second frequency and the third frequency, the second signal at the second frequency and the absence of signal at the first frequency and the third frequency, and the third signal at the third frequency and the absence of signal at the first frequency and the second frequency.

In other features, the third signal is the incoming signal and the third frequency is an expected frequency. In other features, each of the first frequency, the second frequency, and the third frequency are within the 2.4 GHz band. In other features, the predetermined frequency is not a multiple of 2.4 GHz, and wherein the ratio is a non-integer value. In other features, the transmit circuit includes a power amplifier configured to amplify the carrier signal and a transmit antenna configured to transmit the amplified carrier signal.

In other features, setting the first oscillator and the second oscillator occurs within a predetermined lock time.

A method of transmitting and receiving signals includes receiving a plurality of signals and iterating, using a first oscillator, through a set of predetermined frequencies. The method includes identifying, by a second receiver, a sequence of frequency-hopped packets in response to receiving an incoming signal of the plurality of signals at an expected frequency. The expected frequency is included in the set of predetermined frequencies. The method includes, in response to identifying the sequence of frequency-hopped packets, recovering, by a receiver, a reference signal at a reference frequency from the incoming signal and generating and transmitting an enable instruction to a first device.

The method includes, in response to the first device receiving the enable instruction, transmitting the enable instruction to a second device and adjusting, by the first device, a first oscillator frequency of the first oscillator based on the expected frequency of the incoming signal and the reference frequency by averaging the expected frequency over a predetermined period to remove frequency modulation. The method includes, in response to the second device receiving the enable instruction, setting, by the second device, a second oscillator to generate a carrier signal at a predetermined frequency using the reference frequency by averaging the predetermined frequency over the predetermined period to remove frequency modulation. The method includes modulating the carrier signal at the predetermined frequency with transmit data and, in response to the sequence of frequency-hopped packets elapsing, transmitting the modulated carrier signal.

In other features, the second receiver determines the sequence of frequency-hopped packets elapsed in response to an absence of the incoming signal at the expected frequency. In other features, the method includes identifying the sequence of frequency-hopped packets in response to receiving, within a predetermined advertising period, a first signal at a first frequency when the first oscillator is generating the first frequency, a second signal at a second frequency when the first oscillator is generating the second frequency, and a third signal at a third frequency when the first oscillator is generating the third frequency.

A transceiver includes a second receiver configured to receive an incoming signal and detect an advertising event based on the incoming signal and a first oscillator configured to generate a signal at a set of predetermined frequencies to detect the advertising event. The first oscillator is configured to iterate through each predetermined frequency of the set of predetermined frequencies. The set of predetermined frequencies includes a first frequency, a second frequency, and a third frequency. The advertising event is detected in response to receiving the incoming signal at the first frequency when the first oscillator is generating the first frequency, the incoming signal at the second frequency when the first oscillator is generating the second frequency, and the incoming signal at the third frequency when the first oscillator is generating the third frequency.

The transceiver includes a receive circuit configured to receive the incoming signal during the advertising event and, in response to the second receiver indicating the advertising event was detected, recover a reference signal at a reference frequency from the incoming signal. The transceiver includes a first phase lock loop (PLL) interfaced with the first oscillator. The first PLL is configured to lock the first oscillator to the incoming signal using the reference frequency in response to receiving a first enable instruction from the second receiver. The second receiver transmits the first enable instruction to the first PLL in response to detecting the advertising event.

The transceiver includes a transmit circuit including a second oscillator configured to generate a carrier signal. The transmit circuit includes a modulator configured to modulate data over the carrier signal at a carrier frequency and a second PLL interfaced with the second oscillator. The second PLL is configured to lock the second oscillator to the incoming signal using the reference frequency in response to receiving a second enable instruction from the first PLL. The first PLL transmits the second enable instruction to the second PLL in response to locking the first oscillator. The transmit circuit is configured to transmit the modulated carrier signal.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
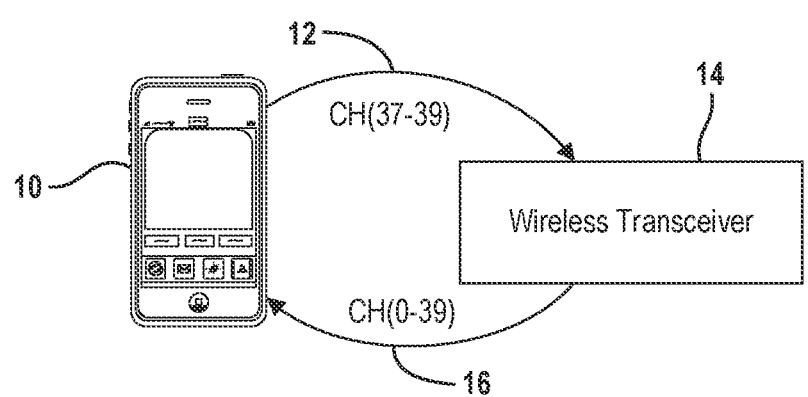
FIG. 1 is a high-level diagram of a wireless transceiver system.

FIG. 1 illustrates a high-level diagram of a wireless transceiver system including a mobile computing device 10 advertising a Bluetooth low energy (BLE) signal 12 over a set of predetermined frequency channels, as shown channels 37 through 39 to a wireless transceiver 14. In other embodiments, the advertising may be a different signal (that is, not BLE). The wireless transceiver 14 transmits a carrier signal 16 over a predetermined frequency channel that is not limited to the channels over which the low energy signal 12 is advertised. The wireless transceiver 14 is a crystal-less transmitter with symmetric over-the-air clock recovery compliant with the BLE standard.

Figure 2:
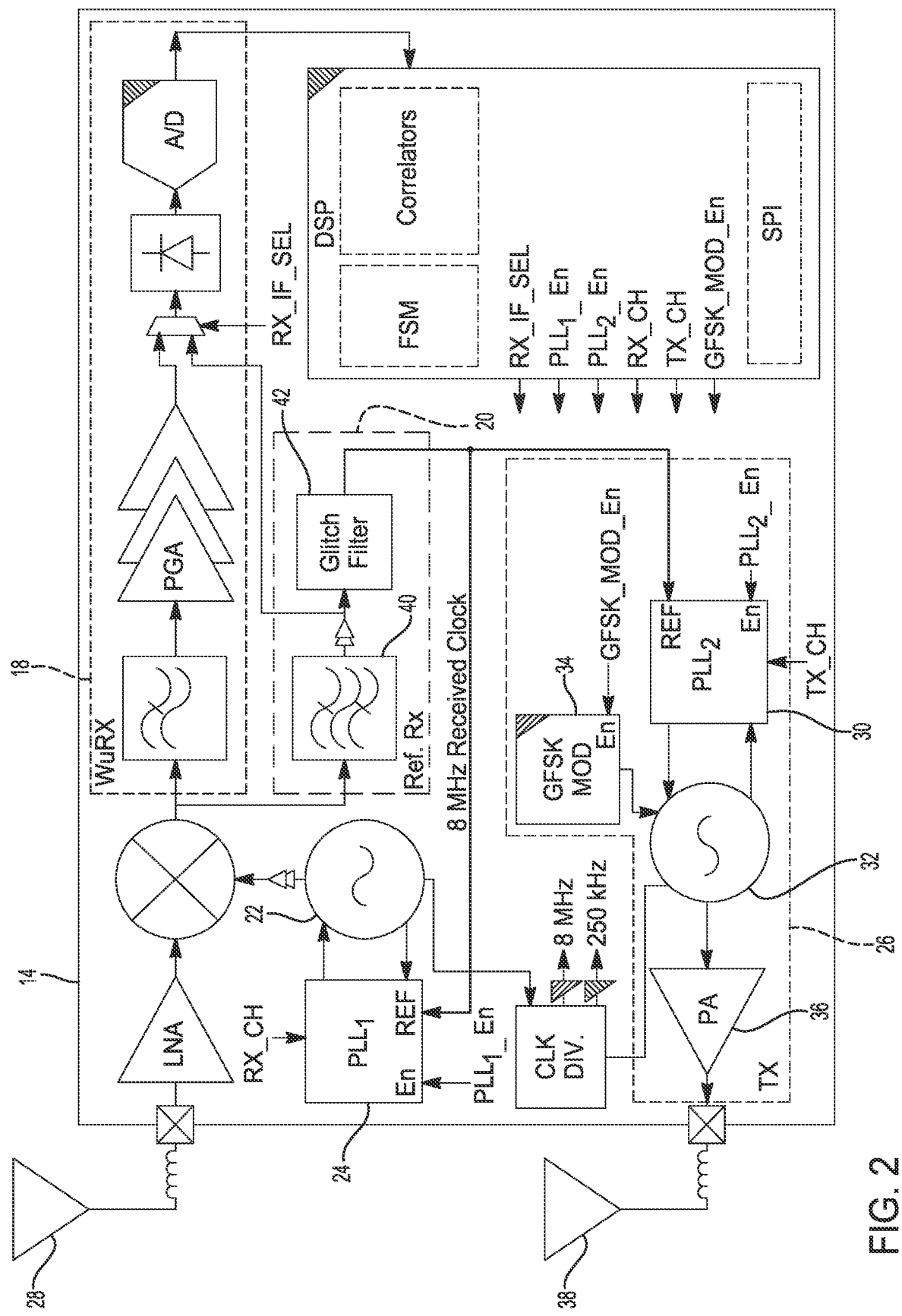
FIG. 2 is a block diagram of a wireless transceiver system excluding a crystal oscillator.

FIG. 2 illustrates a block diagram of the wireless transceiver 14 excluding a crystal oscillator. The wireless transceiver 14 is comprised generally of a wake up receiver 18, a receive circuit 20, a first oscillator 22, a first phase-lock loop (PLL) 24, and a transmit circuit 26. The wireless transceiver 14 is a fully-integrated crystal-less transceiver that receives and transmits BLE compliant messages. It is to be understood that only the relevant components of the wireless transceiver 14 are discussed in relation to FIG. 2, but that other components may be needed to control and manage the overall operation of the wireless transceiver 14, such as a power source.

The wake up receiver 18 is configured to receive advertised signals via a receive antenna 28. The wake up receiver 18 is also configured to identify when a BLE compliant signal is being advertised. While additional signals may be advertised, in the present disclosure, a BLE compliant communication with the wireless transceiver 14 is described. The wake up receiver 18 instructs the other components of the wireless transceiver 14 is engage in response to identifying an advertising event from the mobile computing device 10 shown in FIG. 1. As described in more detail in FIG. 3, a signal is advertised or broadcasted by the mobile computing device 10 at a set of three predetermined frequencies corresponding to a first channel, a second channel, and a third channel.

For BLE compliant devices, the set of three predetermined frequencies are on channel 37, channel 38, and channel 39. The advertising event is a set of three consecutive packets being broadcast by the mobile computing device 10, the first packet advertised at a first frequency of the set of three predetermined frequencies, the second packet is advertised at a second frequency of the set of three predetermined frequencies, and the third packet is advertised at a third frequency of the set of three predetermined frequencies.

The wake up receiver 18 is able to identify when the advertising event is being advertised because the first oscillator 22 is generating the set of three predetermined frequencies in a loop. Then, when the first oscillator 22 is generating the first frequency, the wake up receiver 18 can identify when the advertising signal is being advertised at the first frequency. The wake up receiver 18 operates as a frequency-hopping back-channel receiver to detect advertising events from a broadcaster while rejecting interference, meaning that the advertising signal is detected at the first frequency and no other signal (the absence of additional signals) is being detected at the second and third frequencies.

The wake up receiver 18 identifies the advertising event after receiving the signal at the third frequency. Once the wake up receiver 18 identifies the signal at the third frequency, the wake up receiver 18 instructs the enablement of a plurality of internal signals in order to recover a reference signal from the advertised signal and transmit a carrier signal to the mobile computing device or device advertising the signal.

The receive circuit 20 receives the incoming signal (advertising signal) in response to the wake up receiver 18 identifying the advertising event. The receive circuit 20 recovers an 8 MHz reference clock signal from the incoming signal. The wireless transceiver 14 is able to implement to recovered signal as a reference clock signal, replacing the crystal oscillator, because the wake up receiver 18 has already confirmed that the incoming signal is compliant with a standard associated with the wireless transceiver 14, in this case, BLE compliant.

The wireless transceiver 14 includes two incoming or received signal paths mixed down by the first oscillator 22: (1) a back-channel (BC) direct conversion path for detecting advertising events, and (2) a clock recovery path, implemented by the receive circuit 20, with an intermediate frequency of 8 MHz producing the reference for the first PLL 24 and a second PLL 30 of the transmit circuit 26.

In the second path or the clock recovery path, the incoming signal (BLE packet) is down-converted to an intermediate frequency of 8 MHz and filtered by a sixth order band pass filter 40 (shown in FIG. 6) with a bandwidth of 2 MHz, removing interferers on adjacent channels. The band pass filter 40 is trimmed only once for process variation. A glitch filter 42 removes short pulses that might exist, for example, due to noise. The recovered signal then becomes the reference for the two PLLs, only present while receiving the incoming signal (received as the third BLE packet).

An 8 MHz reference frequency is sufficient for a combined PLL lock time less than one advertising packet, meaning the transmitting local oscillator (the second oscillator) is ready before the end of the advertising event. The 8 MHz reference frequency also relaxes the required band pass filter center frequency and quality factor. Using two local oscillators allows for receiving and transmitting on different BLE channels and for optimizing each PLL controller. The receive circuit 20 forwards the reference frequency to the first PLL 24 and the second PLL 30 as the reference.

The wake up receiver 18 sends an enable signal to the first PLL 24, instructing the first PLL 24 to lock to the incoming signal using the reference frequency (8 MHz clock signal). In various embodiments, an alternative frequency may be selected. The 8 MHz reference frequency is implemented so that the first PLL 24 (and the second PLL 30) lock quickly at a low power. Once the first PLL 24 receives the enable instruction, the first PLL 24 instructs the first oscillator 22 to down-convert the incoming signal frequency by the reference frequency. Therefore, upon detecting the third packet at the third frequency in the advertising event, the first PLL 24 is enabled and locks the first oscillator 22 within 50 μs to the 8 MHz reference recovered from the BLE packet by using a novel averaging controller immune to Gaussian frequency-shift keying (GFSK)-modulated signals.

In other words, the first PLL 24 instructs the first oscillator 22 to generate the incoming signal frequency less the reference frequency and continue to generate the same frequency or lock to the frequency. When waiting to receive the advertising event, the first oscillator 22 is operating as an open loop oscillator and looping through the set of three predetermined frequencies to identify the advertising event. Then, once the wake up receiver 18 identifies the advertising event, the enable instruction results in the first PLL 24 instructing the first oscillator 22 to no longer operate as an open loop oscillator and lock to the incoming signal frequency less the reference frequency.

Figure 4:
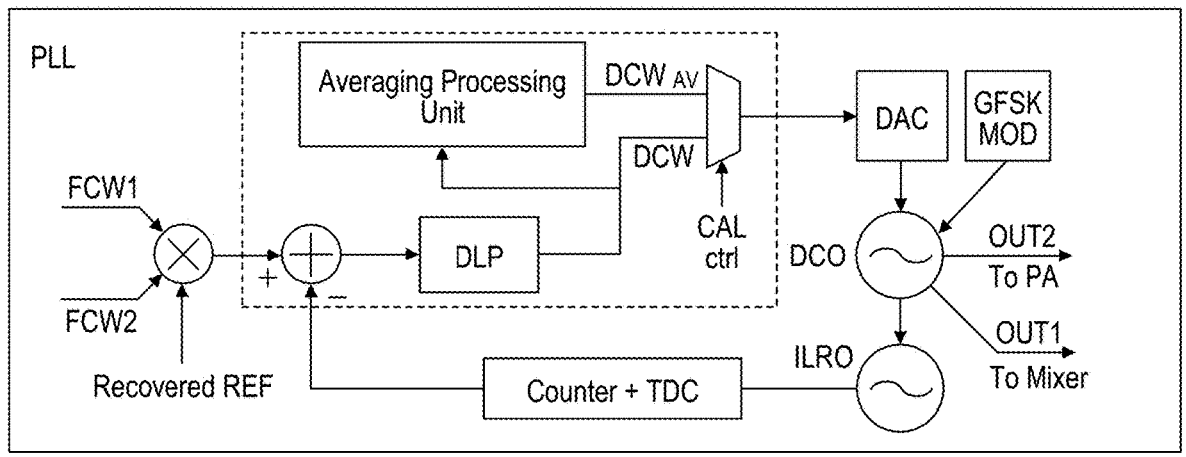
FIG. 4 is a block diagram of an example embodiment of a phase-lock-loop.

As is described in more detail with respect to FIG. 4, the first PLL 24 includes signal averaging functions to average the incoming signal over a predetermined period because data is modulated over the incoming signal (the signal is data whitened) resulting in frequency modulation of the signal. To lock to a particular frequency, the average of the set frequency is to be zero. Therefore, the incoming signal is averaged over the predetermined period.

Once the first PLL 24 is locked, the enable instruction is transmitted to the second PLL 30 included in the transmit circuit 26. Along with the second PLL 30, the transmit circuit 26 also generally consists of a second oscillator 32, a modulator 34, and a power amplifier 36. The architecture of the wireless transceiver 14 is novel due to having the two fast-locking PLLs and a selective baseband filter of the receive circuit 20 to recover a reference clock (reference frequency) from the incoming signal and then transmitting a modulated carrier signal (BLE compliant packet) on any channel. The modulator 34 is a GFSK modulator for open-loop modulation.

Both the first oscillator 22 and the second oscillator 32 are on-chip LC oscillators, are trimmed only once for process variation, and when in back channel scanning mode, operate open-loop without any reference. This is sufficient for a divided second oscillator 32 to clock the digital baseband and for the first oscillator 22 to frequency hop between the set of three predetermined frequencies or advertising channels in the energy-detection back channel path and detect the advertising event.

The second PLL 30 locks the second oscillator 32 in less than 50 μs to the 8 MHz recovered reference with the second oscillator RF centered on any of the 40 BLE channels (that is, channels 0-39). The 8 MHz reference frequency is only present while the third packet is being received, therefore both PLLs must lock before it ends. Finally, after the third packet ends, the chip switches from receive to transmit mode, and the second oscillator 32 is used in open-loop mode to transmit a GFSK-modulated BLE-compliant packet in the desired, predetermined frequency. The modulator 34 modulates transmit data over the carrier signal at the predetermined frequency that is generated by the second oscillator 32 to create a modulated carrier signal. The modulated carrier signal is transmitted via a transmit antenna 38. Selecting a desired frequency is accomplished by setting a ratio of the second PLL 30 to a non-integer value. While the first PLL 24 needs to be configured to receive BLE compliant frequencies, the second PLL 30 is uncoupled from the first PLL 24, providing the freedom of having a non-integer ratio.

Figure 3:
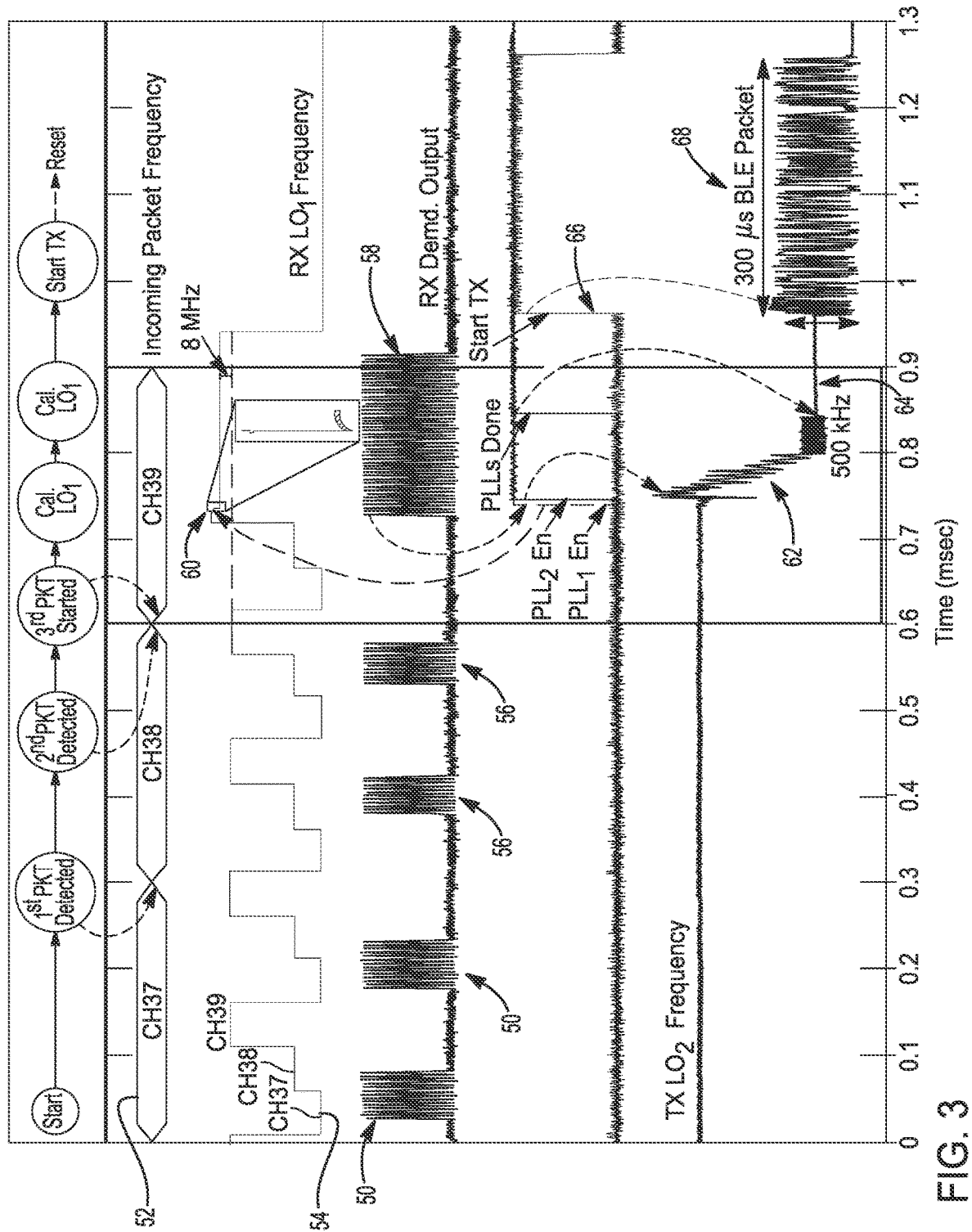
FIG. 3 is a diagram illustrating timing for the proposed initial communication of a wireless transceiver system.

FIG. 3 is a diagram illustrating timing for the proposed pairing of a wireless transceiver system. The timing diagram shows a state diagram and waveforms for the transient operation of the transceiver detecting an advertising event, recovering the 8 MHz reference, and then transmitting a packet. The process begins with the receive back-channel path enabled, scanning the three predetermined frequencies or three BLE advertising channels for a predefined advertising channel hopping sequence and packet length. The advertising channels are CH37, CH38, and CH39 at 2402, 2426, and 2480 MHz, respectively.

The first oscillator hops between channels every 50 μs to oversample and detect the energy of advertising packets. Since the back channel receiver is only scanning for energy in the advertising channels, the first oscillator frequency accuracy is relaxed, and the advertising event can be detected with the first oscillator hopping open-loop. In addition, using direct-conversion simplifies the baseband filtering and gain and reduces this path's power consumption. Once the back channel demodulator detects the intended advertising event by correlating the digitized signal with programmable templates, the receiver switches to the second receive path to recover a clock reference by the receive circuit from the last incoming packet.

As is shown in FIG. 3, the first oscillator frequency (RX LOi frequency) is hopping between a first frequency corresponding to channel 37, a second frequency corresponding to channel 38, and a third frequency corresponding to channel 39. When a mobile computing device is broadcasting a BLE compliant advertising event, the wireless transceiver (via the first receive path or the wake up receiver) detects a first packet (energy) being transmitted using an advertising signal at the first frequency using channel 37. A first energy detection 50 occurs when the broadcasting device is broadcasting a first packet at the first frequency corresponding to channel 37 at 52 and the first oscillator is generating or has hopped to the first frequency at 54.

Similarly, energy is detected at the second frequency corresponding to channel 38 at 56 as well as at the third frequency corresponding to channel 39 at 58. Once the third packet is detected at 58, the wake up receiver of the wireless transceiver identifies the broadcast as an advertising event and (1) recovers the 8 MHz reference frequency (via the receive circuit) by prompting the second receive path to recover the reference frequency and (2) transmits the first enable instruction to the first PLL (shown as PLL$_1$ En), locking the first oscillator to the incoming signal (third packet of the advertising event) using the reference frequency at 60. This ensures that neither of the two PLLs are enabled until a valid advertising event is detected, eliminating false wakeups to provide power conservation and erroneous transmissions to ensure the incoming signal provided during an advertising event is BLE compliant, resulting in the recovered signal being reliable.

Once the first PLL is locked, the second PLL receives an enable instruction (shown as PLL$_2$ En) to lock the second oscillator to a predetermined, desired transmit frequency using the reference frequency. Both PLLs implement an averaging solution to average the incoming, reference frequency over a predetermined period to ensure the averaged generated frequency is zero. The average processing occurs because the incoming signal is data-whitened. Both PLLs are averaging the frequency at 62. The second oscillator is set at 64 to generate the carrier signal at the predetermined, desired frequency. Then, once channel 39 is no longer being advertised, a switch is enabled at 66 to switch the wireless transceiver from receive mode to transmit mode. The wireless transceiver generates modulated carrier signal by modulating transmit data over the carrier signal at the predetermined frequency and transmits the modulated carrier signal via the transmit antenna at 68.

FIG. 4 is a simplified block diagram of both PLLs for reference recovery from the BLE packet and carrier signal transmission. The PLLs are type-I all-digital PLL (ADPLL) with an embedded averaging processing unit (APU) to calibrate the digital control word (DCW) while the PLL is locked. The APU is required because the 8 MHz reference is a data-whitened, GFSK-modulated BLE packet, and the frequency modulation needs to be removed. The frequency accuracy increases with increasing averaging time, and with enough PLL cycles, the influence from GFSK modulation is minimized.

Figure 5:
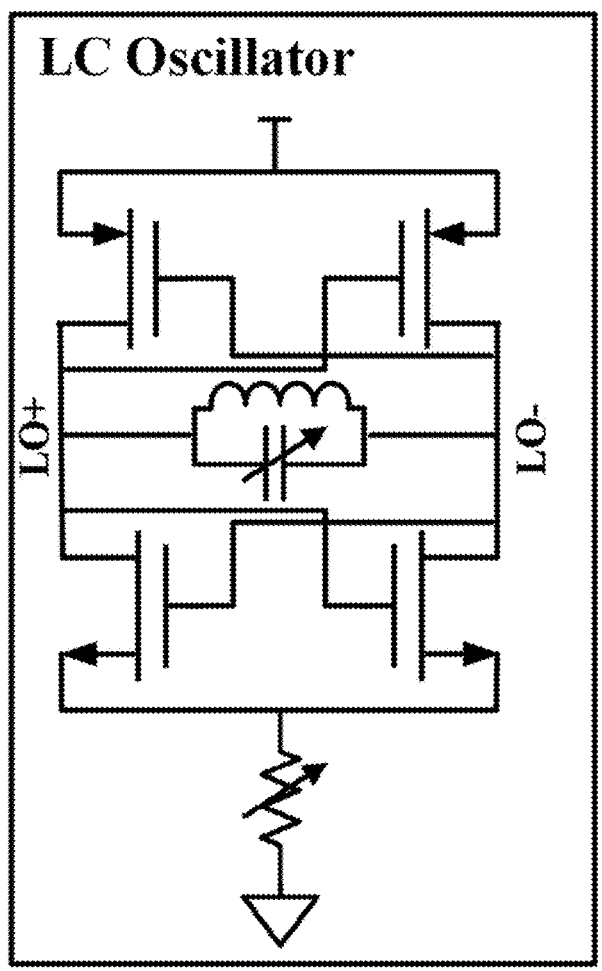
FIG. 5 is a schematic diagram of an example embodiment of a local oscillator.

The PLLs in the receive and transmit paths are controlled by different frequency control words (FCW) and work at separate frequencies. This reduces mutual coupling between the two local oscillators and enables the transmit circuit to transmit in any channel. The local oscillator depicted in FIG. 5 uses both NMOS and PMOS cross-coupled pairs for negative resistance and a digitally tuned resistor tail, which helps keep the transistors out of triode and improves phase noise.

The wireless transceiver implementing an ADPLL with averaging controller to recover a stable reference from a GFSK-modulated data-whitened signal is a further point of novelty. The wireless transceiver with clock recovery meets all BLE requirements for signal-to-interference ratio (SIR), making this a robust solution for removing the crystal oscillator even in densely populated networks.

Figure 6:
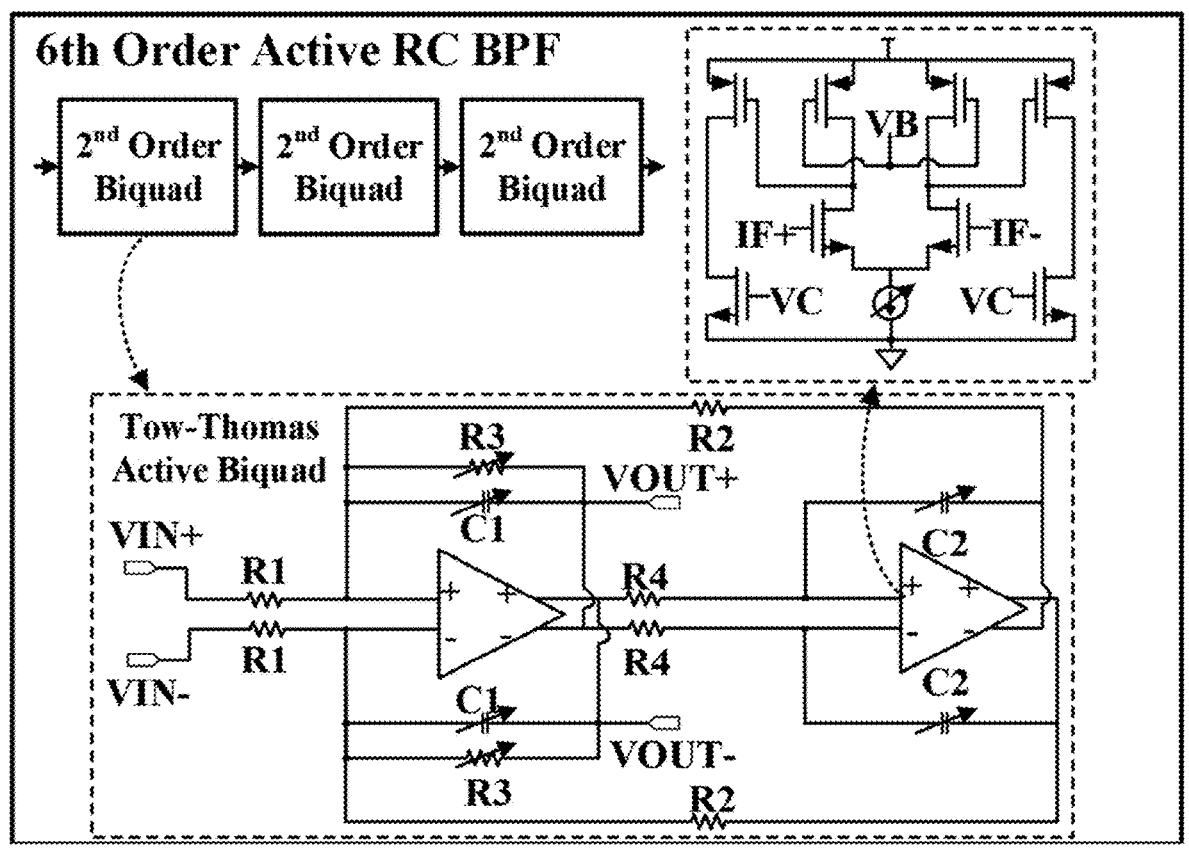
FIG. 6 is a schematic diagram of an example embodiment of a band pass filter.

FIG. 6 depicts a sixth order active RC BPF that is synthesized by cascading three second order biquads. Each biquad stage is fully differential using the Tow-Thomas topology for its lower sensitivity to parasitics. In transmit mode, a switched capacitor digital power amplifier improves efficiency at low power levels.

Figure 7A:
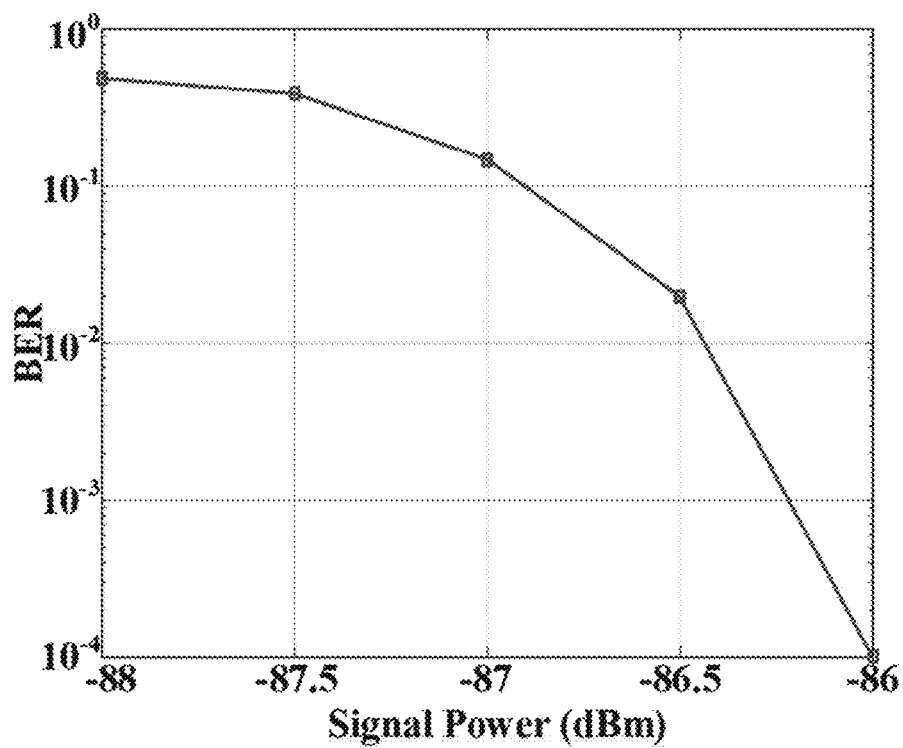
FIG. 7A is a graphical depiction of receiver bit error rate versus signal power.
Figure 7B:
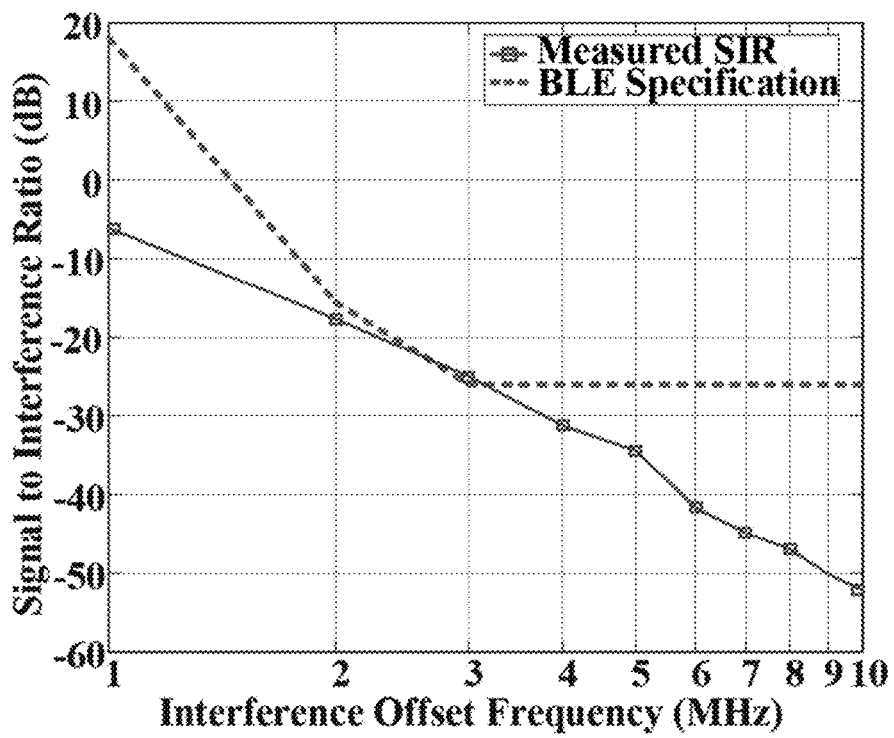
FIG. 7B is a graphical depiction of signal-to-interference ratio versus interference offset frequency.
Figure 7C:
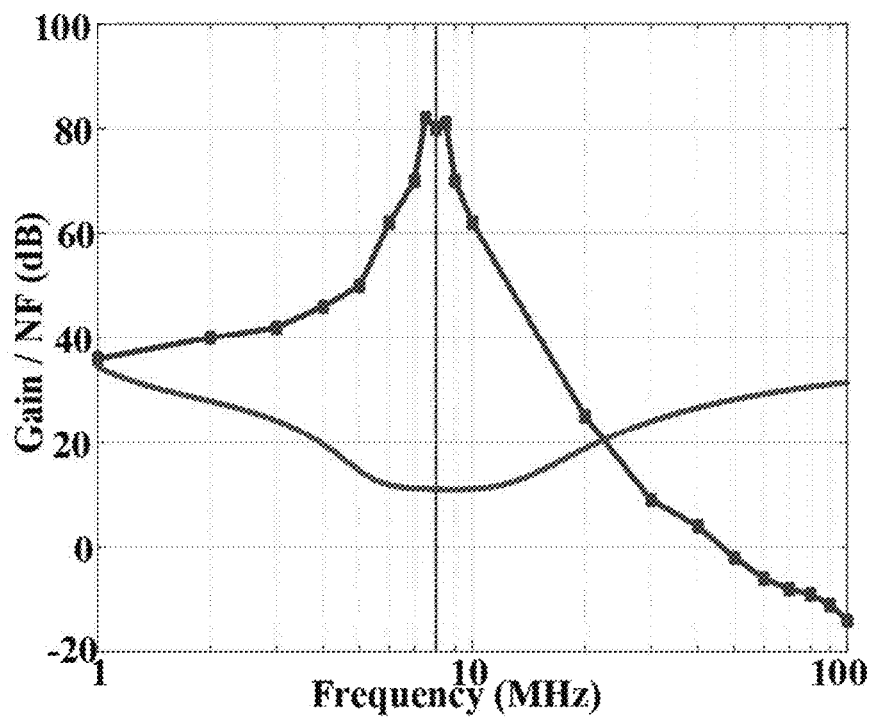
FIG. 7C is a graphical depiction of gain versus frequency.
Figure 7D:
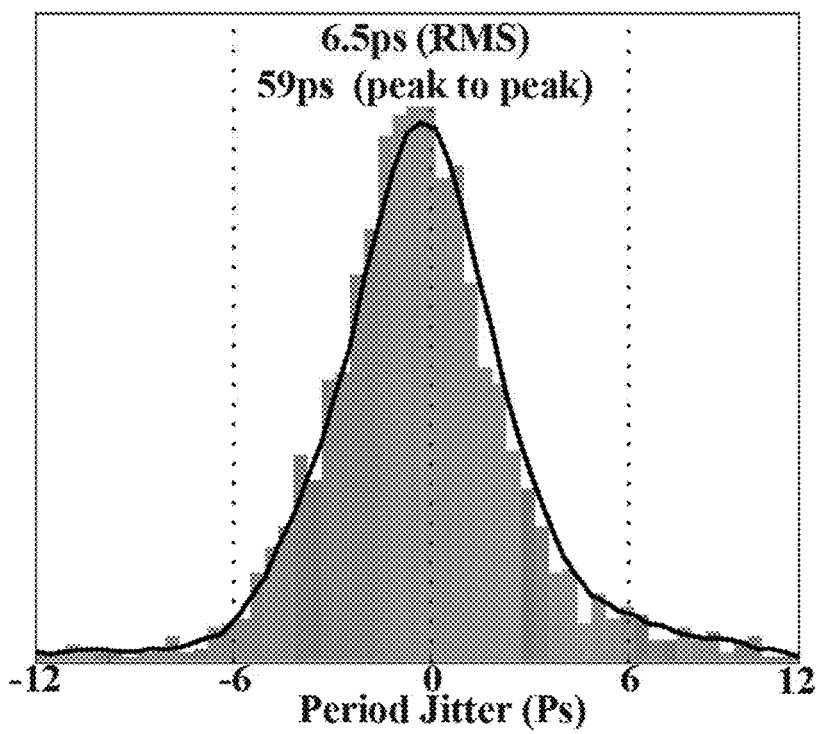
FIG. 7D is a graphical depiction of reference frequency jitter.

The wireless transceiver can be fabricated in a 40 nm CMOS process. FIG. 7A shows the measured sensitivity is −86 dBm at a bit error rate (BER) of $10^{-3}$. FIG. 7B depicts that the SIR when receiving back-channel messages was measured to be −18 dB, −51 dB, and <−60 dB for the $1^{st}$, $5^{th}$ and $10^{th}$ adjacent channels, respectively, meeting the BLE specifications for blocker rejection. The SIR when recovering a reference clock is −20 dB and <−60 dB for the $1^{st}$ and $2^{nd}$ adjacent channels, respectively. FIG. 7C is a graphical depiction of gain versus frequency showing the NF of the clock recovery path is less than 12 dB. FIG. 7D is a graphical depiction of reference frequency jitter. The NF of the clock recovery path is critical to minimize RMS jitter in the recovered clock, which is measured at 6.5 ps in FIG. 7D and is comparable to crystal oscillators operating at similar frequencies.

Figure 8A:
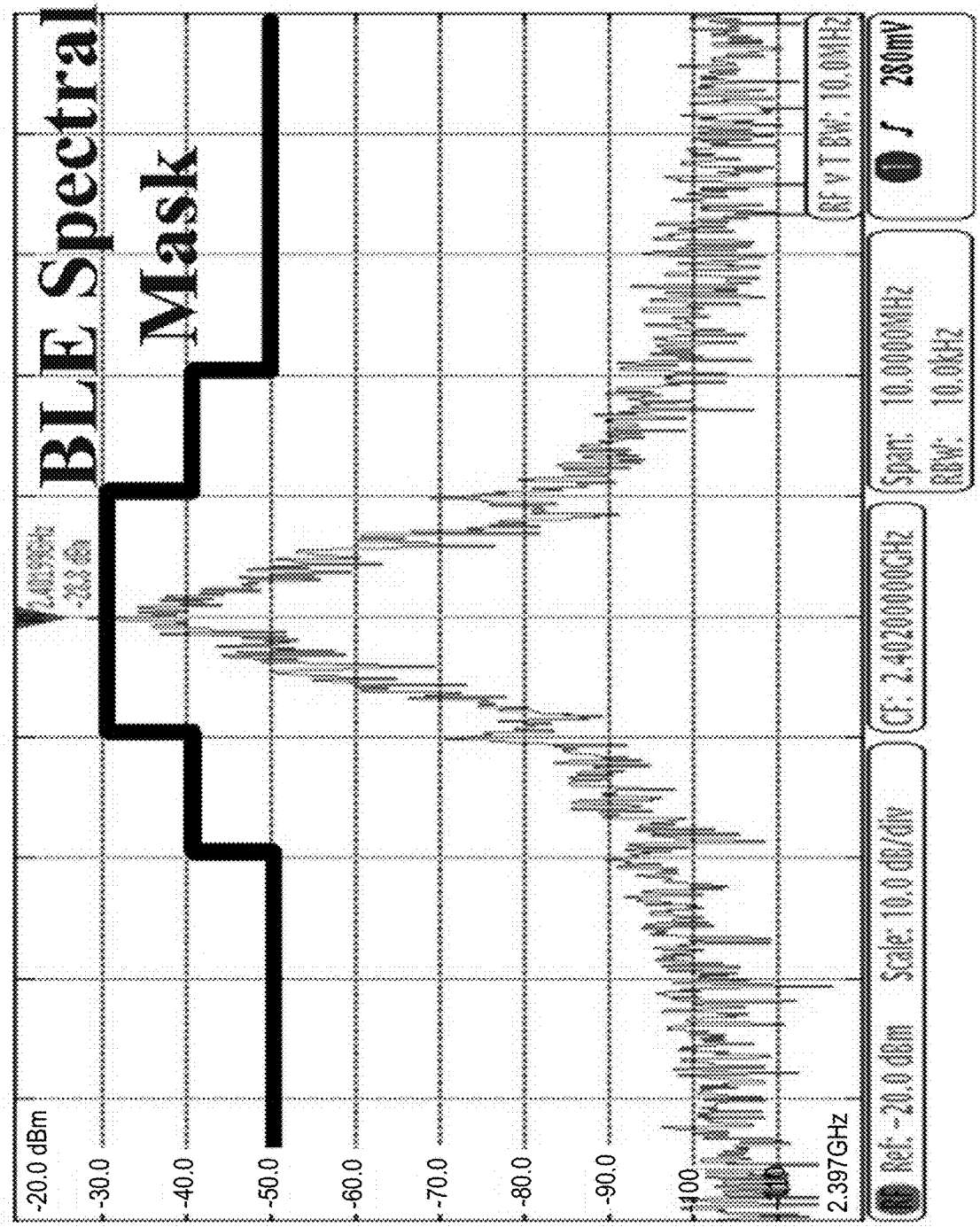
FIG. 8A is a graphical depiction of a carrier signal output spectrum.
Figure 8B:
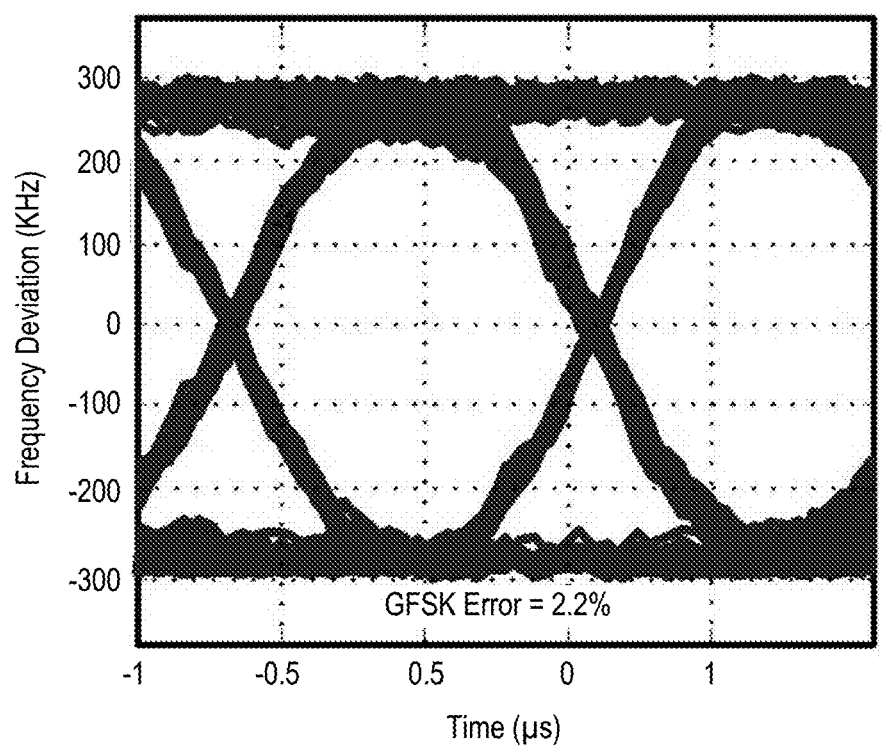
FIG. 8B is a graphical depiction of an eye diagram showing frequency deviation and modulated signal error.
Figure 8C:
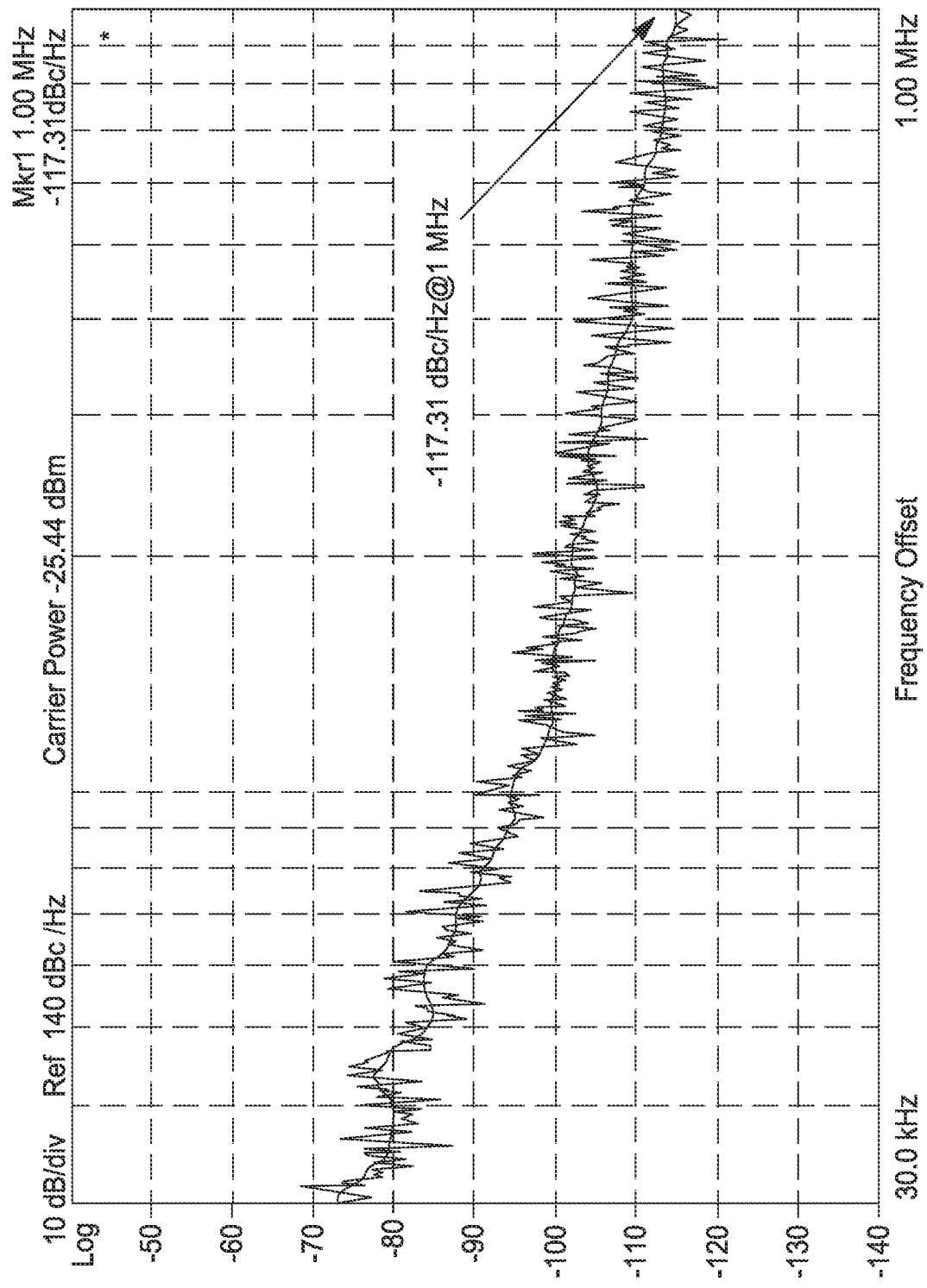
FIG. 8C is a graphical depiction of phase noise.

FIG. 8A shows the carrier signal output spectrum or the GFSK TX output spectrum along with the BLE spectral mask. The measured eye diagram of the carrier signal or transmitted output packet is shown in FIG. 8B, where the clock driving the GFSK modulator is divided down from open-loop first oscillator. The free running LC oscillator archives −117 dBc/Hz phase noise at 1 MHz offset, as shown in FIG. 8C.

The wireless transceiver has the fastest reported frequency calibration time of all crystal-less radios, outperforming previous designs in interference rejection through high-Q filtering and by enabling PLLs only after detecting a valid advertising event when a BLE packet is known to be present.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A transceiver comprising:
  a receive circuit configured to receive an incoming signal, wherein the incoming signal is a wireless packet and, in response to detecting the wireless packet, recover a reference signal at a reference frequency from the incoming signal;
  a first oscillator generates a signal at a set of predetermined frequencies;
  a first phase lock loop (PLL) interfaced with the first oscillator, the first PLL is configured to:
    in response to detecting the wireless packet, adjust a first oscillator frequency of the first oscillator based on an incoming frequency of the incoming signal using the reference frequency; and
  a transmit circuit including:
    a second oscillator configured to generate a carrier signal at a predetermined frequency;
    a modulator configured to modulate data over the carrier signal at the predetermined frequency; and
    a second PLL interfaced with the second oscillator, the second PLL is configured to:
      in response to the first PLL setting the first oscillator, set the second oscillator to generate the carrier signal at the predetermined frequency using the reference signal,
  wherein the transmit circuit is configured to transmit the modulated carrier signal in response to the transmit circuit being set to a transmit mode.

2. The transceiver of claim 1 wherein the first PLL is configured to adjust the first oscillator frequency by averaging the incoming frequency of the incoming signal over a predetermined period, wherein frequency modulation of the reference frequency is removed.

3. The transceiver of claim 1 further comprising:
  a first receiver configured to:
    detect the wireless packet in response to receiving an expected signal at an expected frequency, wherein the expected frequency is included in the set of predetermined frequencies;
transmit a first enable instruction to the first PLL indicating the wireless packet is detected; and
transmit a second enable instruction to the second PLL indicating the first PLL set the first oscillator.

4. The transceiver of claim 3 wherein the wireless packet is a sequence of packets and the transmit circuit is set to the transmit mode in response to a final packet of the sequence of packets elapsing when the first oscillator and the second oscillator are locked to the incoming signal using the reference frequency.

5. The transceiver of claim 1 further comprising:
a mixer interfaced with the receive circuit and the first oscillator,
wherein the first PLL is configured to:
average the incoming frequency of the incoming signal over a predetermined period; and
forward the averaged incoming frequency to the first oscillator for forwarding to the mixer.

6. The transceiver of claim 1 wherein the first oscillator operates as an open loop oscillator when detecting the wireless packet.

7. The transceiver of claim 1 wherein the transceiver excludes a crystal oscillator, and wherein the crystal oscillator does not provide the reference frequency.

8. The transceiver of claim 1 wherein the set of predetermined frequencies includes a first frequency, a second frequency, and a third frequency.

9. The transceiver of claim 1 wherein the first oscillator identifies the wireless packet in response to receiving, within a predetermined advertising period:
a first signal at a first frequency when the first oscillator is generating the first frequency,
a second signal at a second frequency when the first oscillator is generating the second frequency, and
a third signal at a third frequency when the first oscillator is generating the third frequency.

10. The transceiver of claim 9 wherein the wireless packet includes a sequence of packets, and wherein a first receiver identifies the sequence of packets in response to receiving, within the predetermined advertising period:
the first signal at the first frequency and an absence of signal at the second frequency and the third frequency,
the second signal at the second frequency and the absence of signal at the first frequency and the third frequency, and
the third signal at the third frequency and the absence of signal at the first frequency and the second frequency.

11. The transceiver of claim 10 wherein the third signal is the incoming signal and the third frequency is an expected frequency.

12. The transceiver of claim 9 wherein each of the first frequency, the second frequency, and the third frequency are within a 2.4 GHz band.

13. The transceiver of claim 1 wherein the predetermined frequency is not a multiple of 2.4 GHz.

14. The transceiver of claim 1 wherein the transmit circuit includes:
a power amplifier configured to amplify the modulated carrier signal, and
a transmit antenna configured to transmit the amplified modulated carrier signal.

15. The transceiver of claim 1 wherein setting the first oscillator and the second oscillator occurs within a predetermined lock time.

16. A method of transmitting and receiving signals comprising:
receiving a plurality of signals;
iterating, using a first oscillator, through a set of predetermined frequencies;
identifying, by a first receiver, a sequence of frequency-hopped packets in response to receiving an incoming signal of the plurality of signals at an expected frequency, wherein the expected frequency is included in the set of predetermined frequencies;
in response to identifying the sequence of frequency-hopped packets:
recovering, by a second receiver, a reference signal at a reference frequency from the incoming signal; and
generating and transmitting an enable instruction to a first device;
in response to the first device receiving the enable instruction:
transmitting the enable instruction to a second device; and
adjusting, by the first device, a first oscillator frequency of the first oscillator based on the expected frequency of the incoming signal and the reference frequency; and
in response to the second device receiving the enable instruction:
setting, by the second device, a second oscillator to generate a carrier signal at a predetermined frequency using the reference frequency;
modulating the carrier signal at the predetermined frequency with transmit data; and
in response to the sequence of frequency-hopped packets elapsing,
transmitting the modulated carrier signal.

17. The method of claim 16 wherein the first receiver determines the sequence of frequency-hopped packets elapsed in response to an absence of the incoming signal at the expected frequency.

18. The method of claim 16 further comprising identifying the sequence of frequency-hopped packets in response to receiving, within a predetermined advertising period:
a first signal at a first frequency when the first oscillator is generating the first frequency,
a second signal at a second frequency when the first oscillator is generating the second frequency, and
a third signal at a third frequency when the first oscillator is generating the third frequency.

19. The method of claim 18 further comprising identifying the sequence of frequency-hopped packets in response to receiving, within the predetermined advertising period:
the first signal at the first frequency and an absence of signal at the second frequency and the third frequency,
the second signal at the second frequency and the absence of signal at the first frequency and the third frequency, and
the third signal at the third frequency and the absence of signal at the first frequency and the second frequency.

20. A transceiver comprising:
a first end receiver configured to receive an incoming signal and detect an advertising event based on the incoming signal;
a first oscillator configured to generate a signal at a set of predetermined frequencies to detect the advertising event, wherein the first oscillator is configured to iterate through each predetermined frequency of the set of predetermined frequencies, and wherein the set of predetermined frequencies includes a first frequency, a second frequency, and a third frequency, wherein the advertising event is detected in response to receiving:

the incoming signal at the first frequency when the first oscillator is generating the first frequency;

the incoming signal at the second frequency when the first oscillator is generating the second frequency; and the incoming signal at the third frequency when the first oscillator is generating the third frequency;

a receive circuit configured to receive the incoming signal during the advertising event and, in response to the first receiver indicating the advertising event was detected, recover a reference signal at a reference frequency from the incoming signal;

a first phase lock loop (PLL) interfaced with the first oscillator, the first PLL is configured to:

lock the first oscillator to the incoming signal using the reference frequency in response to receiving a first enable instruction from the first receiver, wherein the first receiver transmits the first enable instruction to the first PLL in response to detecting the advertising event; and a transmit circuit including:

a second oscillator configured to generate a carrier signal;

a modulator configured to modulate data over the carrier signal at a carrier frequency; and a second PLL interfaced with the second oscillator, the second PLL is configured to:

lock the second oscillator to the incoming signal using the reference frequency in response to receiving a second enable instruction from the first PLL, wherein the first PLL transmits the second enable instruction to the second PLL in response to locking the first oscillator, wherein the transmit circuit is configured to transmit the modulated carrier signal.

* * * * *